United States Patent
Cwik et al.

(12) 
(10) Patent No.: US 6,646,888 B2
(45) Date of Patent: Nov. 11, 2003

(54) LOW INDUCTANCE MULTIPLE RESISTOR EC CAPACITOR PAD

(75) Inventors: Manfred Cwik, Holzgerlingen (DE); Harald Pross, Wildberg (DE); Rene Frank Schrottenholzer, Gaeufelden (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/261,304

(22) Filed: Sep. 30, 2002

(65) Prior Publication Data

US 2003/0063447 A1 Apr. 3, 2003

(30) Foreign Application Priority Data

Oct. 2, 2001 (EP) .............................. 01123613

(51) Int. Cl.⁷ ................................. H05K 7/12
(52) U.S. Cl. ................ 361/767; 361/777; 361/803; 257/692; 257/691; 257/723; 174/255; 174/260
(58) Field of Search ................ 361/767, 777, 361/803, 808; 174/255, 260, 691, 692, 723, 724

(56) References Cited

U.S. PATENT DOCUMENTS

| | | | |
|---|---|---|---|
| 5,120,258 A | * 6/1992 | Carlton | 439/581 |
| 5,303,122 A | 4/1994 | Adams, Jr. et al. | 361/767 |
| 5,616,952 A | * 4/1997 | Nakano et al. | 257/659 |
| 5,729,438 A | * 3/1998 | Pieper et al. | 361/760 |
| 5,823,790 A | * 10/1998 | Magnuson | 439/63 |
| 5,895,968 A | * 4/1999 | Barber | 257/692 |
| 6,376,920 B1 | * 4/2002 | Ikegami et al. | 257/786 |

* cited by examiner

*Primary Examiner*—David Martin
*Assistant Examiner*—Hung Bui
(74) *Attorney, Agent, or Firm*—Lynn L. Augspurger

(57) ABSTRACT

According to the present invention a pad arrangement is provided for applying reworks or engineering changes to an electronic circuits to be formed on the circuit board, the pad arrangement comprising a first signal pad for being electrically connected to a first signal line, a second signal pad for being electrically connected to a second signal line, a ground pad being connected to a ground line provided on the circuit board, and a voltage pad being connected to a supply voltage line provided on the circuit board, whereby the pads are arranged in proximity to each other for facilitating a placement of electronic devices between at least two of the pads.

8 Claims, 4 Drawing Sheets

LOW INDUCTANCE MULTIPLE RESISTOR EC CAPACITOR PAD

BACKGROUND OF THE INVENTION

1. Field of the Invention

The present invention generally relates to a printed circuit board having at least one pad on which a surface mounted device can be mounted. Particularly, the present invention relates to a pad arrangement on a printed circuit board for applying reworks or engineering changes to an electronic circuits to be formed on said circuit board.

2. Description of the Related Art

The majority of electronic devices are now packaged with their electronic components mounted on printed circuit boards (PCB). PCBs have electrically conductive paths that are often connected to electrically conductive pads upon which surface mounted devices (SMDs) can be mounted. Typically, these SMDs are resistors or capacitors. However, SMDs can also be inductors, jumpers, i.e., a removable wire or small plug whose presence or absence is used to determine some aspect of hardware configuration, or other electrical components known to those of ordinary skill in the art.

Generally, the electrical element of an SMD is carried within a ceramic or plastic package having two conductive end portions that are connected internally to the electrical element and a nonconductive center portion. To permanently connect the SMD electrically to the PCB, its conductive end portions are soldered to appropriately spaced conductive pads provided on the surface of the PCB.

Problems can arise, whenever changes to the layout of the electronic circuit get necessary. May it because of reworks or engineering changes, e.g., due to design requirements or the desire to substitute one SMD for another, the size of an SMD might change. In order to avoid a potentially costly redesign of the PCB layout some arrangements could be made.

U.S. Pat. No. 5,303,122 by Clifford G. Adams, Jr. et. al., assigned to Ford Motor Company, filed May 19, 1993, issued Apr. 12, 1994, "Printed circuit board having a commonized mounting pad which different sized surface mounted devices can be mounted", discloses a printed circuit board having a unique commonized pad upon which different sized surface mounted devices can be mounted. The preferred form of the commonized pad comprises two electrically conductive pads, each having a tapered portion that electrically connects a narrow portion to a wide portion. The present invention is advantageous over known pads in that it (1) allows for using different sizes of surface mounted devices without redesign and (2) it does not require wasting what might otherwise be antiquated inventory or continuation of an old process to use up what would be antiquated inventory.

In some cases it is more than a question of the size of a SMD. Additional, wires might be required to be connected to the PCB or an additional electrical connection from one surface of the PCB to the other surface may be needed. For this case simple pad arrangements were introduced that would only be used in case of a rework or an engineering change.

Such a pad arrangement 100 is depicted in FIG. 1. As it can be seen from FIG. 1, there is a first conductive pad 102 and a second conductive pad 104. The first conductive pad 102 is formed by a basically rectangularly shaped central portion 106 having truncated corners and a rectangularly shaped extension 108 being provided for receiving a via 110 connecting the first conductive pad 102 to a respective pad (not shown) on the opposite surface of a PCB (not shown). The second conductive pad 104 comprises tree basically rectangularly shaped conductive portions 120, 122 and 124 being connected to each other by two trapezoidal conductive portions 126 and 128, all together forming basically an annulus running approximately half around the first conductive pad 102. The second conductive pad 104 further comprises in one of the trapezoidal conductive portions 128 a via 130 connecting the second conductive pad to a ground line (not shown) provided in the PCB.

OBJECT OF THE INVENTION

Starting from this, the object of the present invention is to provide a pad arrangement on a printed circuit board that allows flexibly applying reworks or engineering changes to an electronic circuits to be formed on said circuit board.

BRIEF SUMMARY OF THE INVENTION

The foregoing object is achieved by a pad arrangement as laid out in the independent claims. Further advantageous embodiments of the present invention are described in the sub claims and are taught in the following description.

According to the present invention a pad arrangement is provided for applying reworks or engineering changes to an electronic circuits to be formed on the circuit board, the pad arrangement comprising a first signal pad for being electrically connected to a first signal line, a second signal pad for being electrically connected to a second signal line, a ground pad being connected to a ground line provided on the circuit board, and a voltage pad being connected to a supply voltage line provided on the circuit board, whereby the pads are arranged in proximity to each other for facilitating a placement of electronic devices between at least two of the pads.

In a preferred embodiment according to the present invention the group of two signal pads, a ground pad and a voltage pad is substantially being arranged in the edges of a square, whereby in a refinement the ground pad and the voltage pad are arranged next to each other.

In order to reduce the inductance on the PCB the connection between the ground pad to the ground line and between the voltage pad to the voltage line are formed basically on the edge of the respective pad which is closest to the respective other of both pads.

According to another embodiment of the present invention the ground pad extends on the respective surface of the circuit board basically around the adjacent signal pad forming further areas for soldering electrical elements onto. In a refinement the ground pad even extends further to the opposite side of the second signal pad, providing an additional shielding from electrical interferences and more possibilities for connecting surface mounted devices (SMD) and electrical wires, such as coaxial cable, to the pads and in particular to the ground pad. A coaxial cable is a kind of cable having a solid central conductor surrounded by an insulator, in turn surrounded by a cylindrical shield woven from fine wires. It is used to carry high frequency signals, in the area of radio frequencies. The shield is usually connected to electrical ground to reduce electrical interference. In the present case the shield may be connected to a portion of the ground pad.

In order to provide further flexibility and to allow a connection from one surface of the PCB to the other, the pad arrangement further comprises in another embodiment a third signal pad being electrically connected to the first signal pad, a fourth signal pad being electrically connected to the second signal pad, another ground pad being connected to a ground line provided on the circuit board, and another voltage pad being connected to a supply voltage line provided on the circuit board, whereby the pads are placed on the opposite surface of the PCB and are again arranged in proximity to each other for facilitating a placement of electronic devices between at least two of the pads. To improve crosstalk behavior, the connection between the first signal pad to the third signal pad and between the second signal pad to the fourth signal pad are formed basically on the edge of the respective pad which is furthest away from the respective other of both pads.

The pad arrangement in accordance with the present invention is placed as prevention of costly and time consuming modifications of cards or PCBs because of potential reworks and engineering changes. It is advantageously applied in order to get connectivity between the front and back side of double side mounted cards and PCBs. In addition, with embedded wires placed in an intermediate layer of the PCB, the pad arrangement according to the present invention may be used, to tunnel blockages or get in to closed areas. Hence, with the design as taught by the present invention one has an tremendous improvement and advantages compared to the known designs.

In addition to the traditional pads, the novel pad arrangement according to the present invention offers particularly the following advantages. The combination of the four pads to a quadrant, with one supply voltage (VCC), one ground (GND) and two signal connections provides the capability and variations to place 0603-SMT (Surface Mounted Technology) components manually or 0805-SMT components automatically on such pads. The variation of placing SMT components within these quadrants can be done in X-direction or Y-direction, to get the functional engineering change (EC) and rework (REA) capability of a serial resistor EC/REA (+2 EC-wire), serial capacitor EC/REA (+2 EC-wire), tie up resistor (+EC-wire), tie down resistor (+EC-wire), capacitor+2 EC-Wires (Highpass), capacitor+1 EC-Wire (Lowpass) or a bypass caps (+up to 2 EC-Wires). The usage of these different EC/REA capabilities can even be combined, except the one with the Serials and the Highpass functions.

The design with all these capabilities is anyhow very small (210 mil×300 mil), so that with one or more of pad arrangements according to the present invention the hazard of card redesigns or scrapping defect cards during manufacturing is much lower. Smaller ground pads adjacent to the signal pads may be used for coaxial cable repair to solder down the respective shield.

The supply voltage and the ground pad via is moved very close to each other and nearby the SMT component contact area, to reduce the overall lead inductance. This will make the pad arrangement according to the present invention also very robust for high frequency design ECs (Engineering Changes) and REAs (Reworks).

Since two signal pads are coming along the novel design (and this very close to each other and very homogenous), one now has the capability to EC/REA also differential pairs without any problems. In short, particularly the following repair scenarios may be possible, Single Net EC/Repair (Front to Rear), Differential Pair EC/Repair (Front to Rear), Resistor EC/Repair, tie-up Resistor+EC-wire, tie-down Resistor+EC-wire, Serial Resistor+2 EC-Wire, Capacitor EC/Repair, Bypass, Capacitor+2 EC-Wires (Highpass), Capacitor+1 EC-Wire (Lowpass) Further a combined usage may be possible within very dense dimensions only 210 mil times 300 mil, furthermore, overlay capability during multiple usage combined usage of the different advantages and test point access capability.

BRIEF DESCRIPTION OF THE SEVERAL VIEWS OF THE DRAWINGS

The above, as well as additional objectives, features and advantages of the present invention, will be apparent in the following detailed written description.

The novel features of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DETAILED DESCRIPTION OF THE INVENTION

Figure 1:
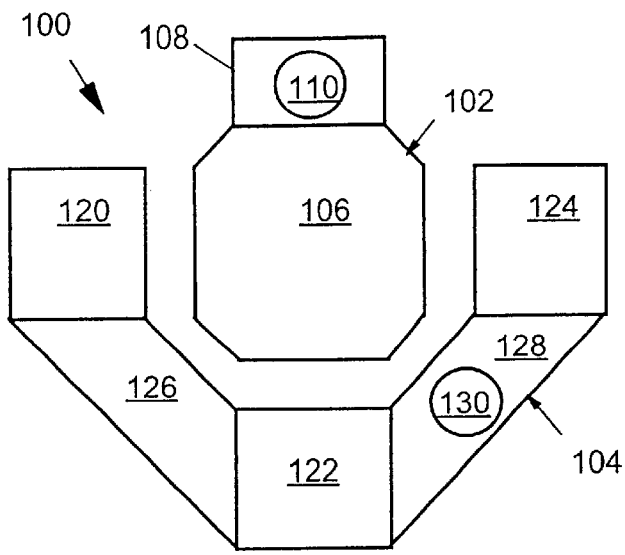
FIG. 1 shows a pad arrangement according to the prior art.
Figure 2:
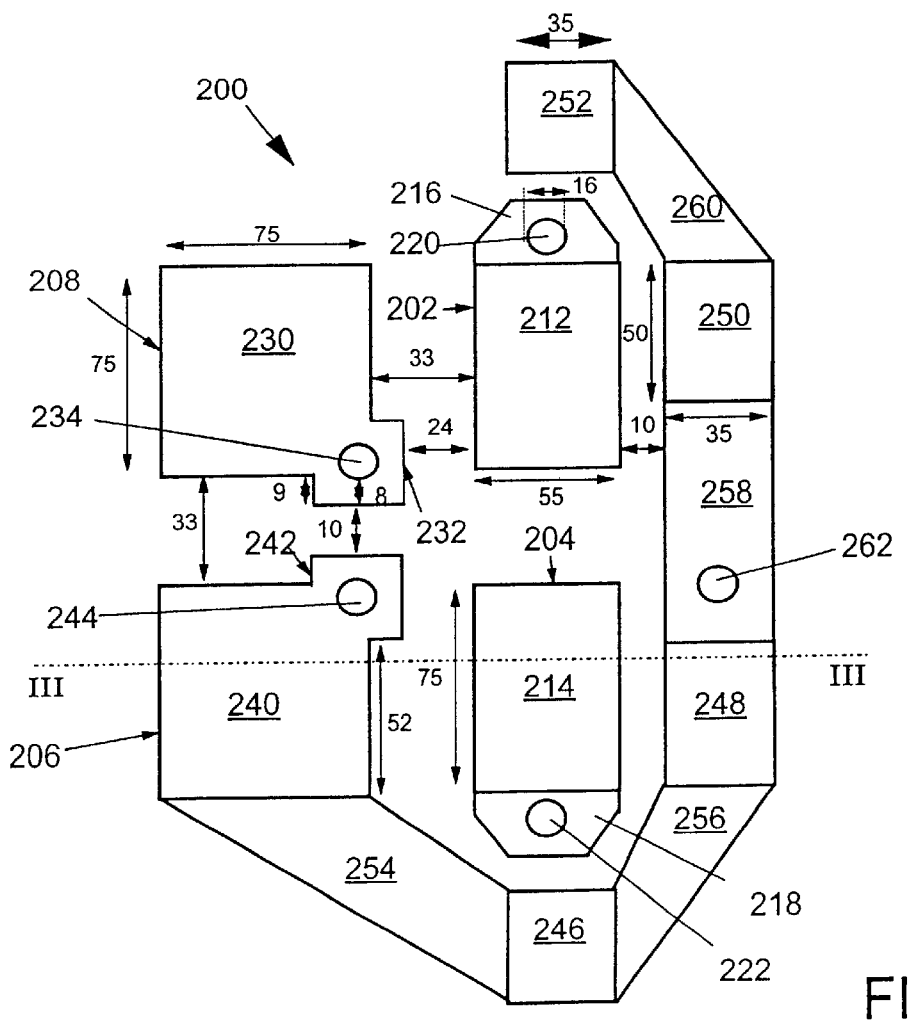
FIG. 2 shows a low inductance multiple resistor EC capacitor pad arrangement in accordance with the present invention.

With reference now to FIG. 2, there is depicted a low inductance multiple resistor engineering change/rework capacitor pad arrangement 200 in accordance with the present invention. The drawings is not in scale and the written dimensions are all in mils (1/1000 inch). However, it is acknowledged that these dimensions are only by way of example and may be varied in accordance to design constraints, such as the size of SMT components.

The pad arrangement 200 comprises a first signal pad 202, a second signal pad 204, a ground pad 206 and a voltage pad 208. All pads 202, 204, 206 and 208 are made from conductive material. The area between the pads 202, 204, 206 and 208 is non conductive, so that the pads 202, 204, 206 and 208 are electrically separated from each other.

The first signal pad 202 and the second signal pad 204 are both formed by a basically rectangularly shaped central portion 212 and 214. Both show a basically trapezoid extension 216 and 218. In each of the basically trapezoid extensions 216 and 218 a via 220 and 222 is arranged connecting the first signal pad 202 to a respective pad (not shown) on the opposite surface of a PCB (not shown) and the second signal pad 204 to a respective pad (not shown) on the opposite surface of the PCB (not shown), whereby the vias 220 and 222 are formed basically on the edge of the respective pad 202 and 204 which is furthest away from the respective other of both pads 202 and 204.

The voltage pad 208 is formed by a basically square shaped main portion 230 with a basically square shaped extension 232 in one of its corners. In the basically square shaped extension 232 a via 234 is arranged connecting the voltage pad 208 to a supply voltage line (not shown) provided on the PCB.

Like the voltage pad 208, the ground pad 206 includes as well a basically square shaped main portion 240 with a basically square shaped extension 242 in one of its corners. In the basically square shaped extension 242 a via 244 is arranged connecting the ground pad 206 to a ground line (not shown) provided on the PCB. However the ground voltage pad 208 further comprises four basically rectangularly shaped conductive pads 246, 248, 250 and 252 which are electrically connected to one another by intermediate conductive portions 254, 256, 258 and 260. Both the conductive pads 246, 248, 250 and 252 together with the intermediate conductive portions 254, 256, 258 and 260 form a integral area of conductive material running from close to the voltage pad 206 around the neighboring second signal pad 204 and basically half way around the first signal pad 202. One more via 262 is provided in the intermediate portion 258.

Figure 3:
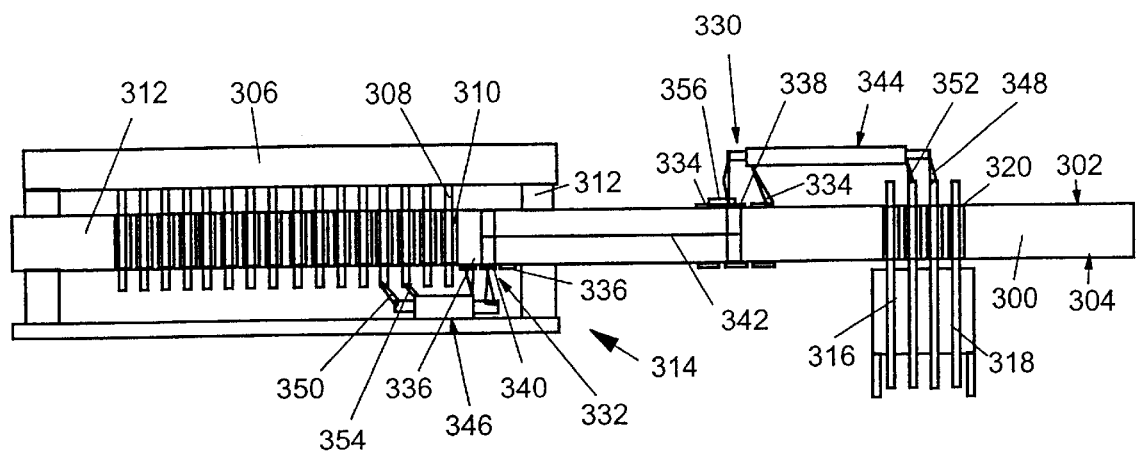
FIG. 3 shows a usecase for employing the pad arrangement of FIG. 2 on a PCB.

Now with reference to FIG. 3, there is shown a usecase for employing the pad arrangement of FIG. 2 on a printed circuit board (PCB). A PCB 300 comprises a first surface 302 and a second surface 304. On the first surface 302 there is mounted an integrated circuit 306 having a plurality of pins 308 extending through respective openings 310 provided in the PCB 300. The integrated circuit 306 is abuts on a support device 312 sitting on to of the first surface 302 of the PCB 300. On the second surface 304 the tips of the pins 308 extending through the openings 310 provided in the PCB are covered by a housing 314. Further along the PCB on its second surface 304 another electronic device 316 is provided having four pins 318 extending through respective holes 320 formed in the printed circuit board 300.

A first pad arrangement 330 in accordance to the present invention is placed on the first surface 302 of the PCB 300 basically in the middle of the integrated circuit 306 and the pins 318 of the electronic device 316 extending through the PCB. A second pad arrangement 332 is placed inside the housing 314 on the second surface 304 of the PCB 300. Since the pad arrangements 330 and 332 are shown in a cross section according to the line III—III of FIG. 2, only two portions of the ground pad 334 and 336 and one signal pad 338 and 349 can be seen from each pad arrangement 330 and 332. The signal pads 338 and 340 from both pad arrangements 330 and 332 are electrically connected to each other by an embedded wire 342. The ground pad, however, is connected to a respective ground line (not shown) provided on the PCB.

As an example of an engineering change or rework a first coaxial cable 344 and a second coaxial cable 346 are employed. Both coaxial cables 344 and 346 have a solid central conductor 348 and 350 surrounded by an insulator, in turn surrounded by a cylindrical shield 352 and 354 woven from fine wires. The cylindrical shield 352 of the first coaxial cable 344 is on one side electrically connected to one of the pins 318 of the electronic device 316. The other side of the cylindrical shield 352 of the first coaxial cable 344 is electrically connected to a portion of the ground pad 334 of the first pad arrangement 330. The central conductor 348 of the first coaxial cable 344 is on one side electrically connected to another of the pins 318 of the electronic device 316. The other side of the central conductor 348 of the first coaxial cable 344 is electrically connected to a portion of the signal pad 338 of the first pad arrangement 330.

Correspondingly, the cylindrical shield 354 of the second coaxial cable 346 is on one side electrically connected to one of the pins 308 of the integrated circuit 306. The other side of the cylindrical shield 354 of the second coaxial cable 346 is electrically connected to a portion of the ground pad 336 of the second pad arrangement 332. The central conductor 350 of the second coaxial cable 346 is on one side electrically connected to another of the pins 308 of the integrated circuit 306. The other side of the central conductor 350 of the second coaxial cable 346 is electrically connected to a portion of the signal pad 340 of the second pad arrangement 332. By means of the embedded wire 342 the central conductor 348 of the first coaxial cable 344 is electrically connected to the central conductor 350 of the second coaxial cable 346, thus, providing a electrical connection from the first surface 302 of the PCB 300 to its second surface 304. In addition to the first coaxial cable 344 a SMT component 356 is electrically connected to the ground pad 334 and the signal pad 338 of the first pad arrangement 330.

Figure 4:
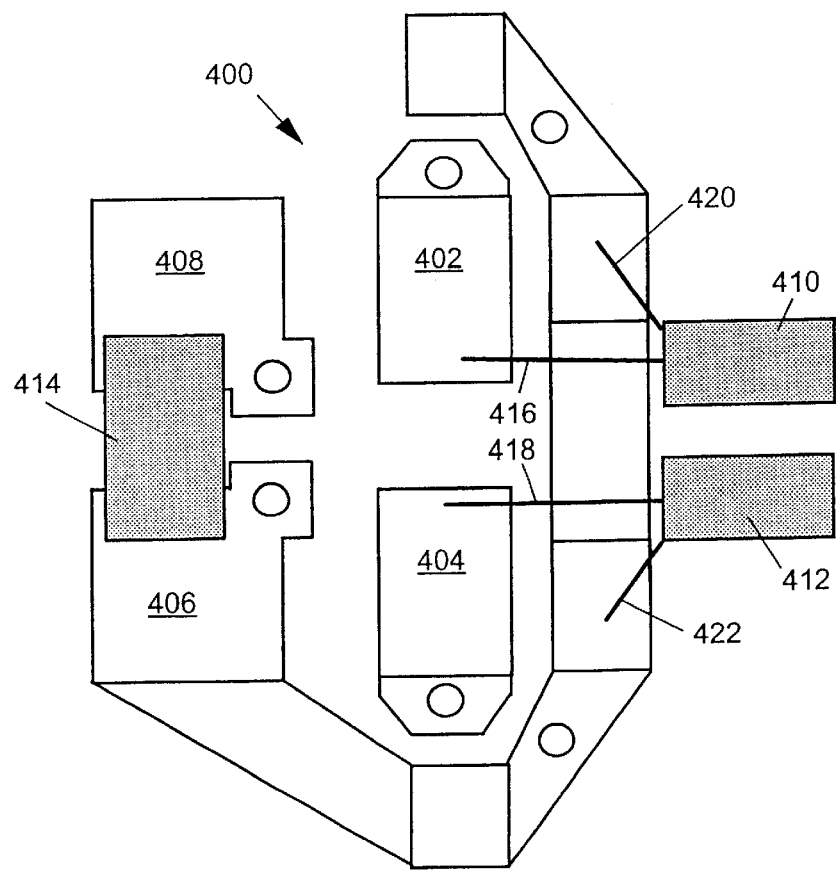
FIG. 4 shows the pad arrangement of FIG. 2 with an engineering change/rework with a coaxial cable and a low inductance bypass capacitor in accordance with the present invention.

FIG. 4 shows a pad arrangement 400. the pad arrangement 400 comprises a first signal pad 402, a second signal pad 404, a ground pad 406 and a voltage pad 408 as explained in greater detail with reference to FIG. 2. To the pad arrangement 400 an engineering change/rework has been applied comprising a first coaxial cable 410 and a second coaxial cable 412 as well as a low inductance bypass capacitor 414. The low inductance bypass capacitor 414 is electrically connected between the voltage pad 408 and the ground pad 406.

Both coaxial cables 410 and 412 have a solid central conductor 416 and 418 surrounded by an insulator, in turn surrounded by a cylindrical shield 420 and 422 woven from fine wires. The cylindrical shield 420 of the first coaxial cable 410 is electrically connected to a portion of the ground pad 406. The central conductor 416 of the first coaxial cable 410 is electrically connected to the first signal pad 402. The cylindrical shield 422 of the second coaxial cable 412 is as well electrically connected to a portion of the ground pad 406. The central conductor 418 of the second coaxial cable 412, however, is electrically connected to the second signal pad 404.

Figure 5:
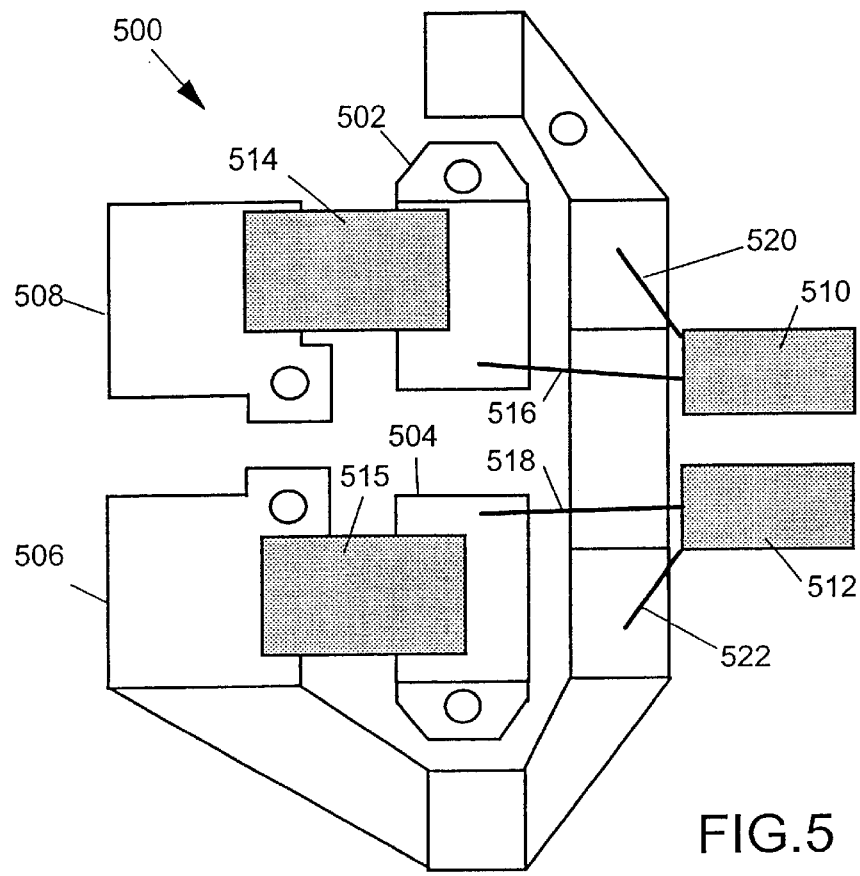
FIG. 5 shows the pad arrangement of FIG. 2 with a tie up/tie down engineering change/rework circuitry with two coaxial cables in accordance with the present invention.

With reference to FIG. 5, there is depicted the pad arrangement 500 comprises a first signal pad 502, a second signal pad 504, a ground pad 506 and a voltage pad 508 as explained in greater detail with reference to FIG. 2. To the pad arrangement 500 an engineering change/rework has been applied comprising a first coaxial cable 510 and a second coaxial cable 512 as well as a a tie up/tie down engineering change/rework circuitry consisting of a first resistor 514 and a second resistor 515. The first resistor 514 is electrically connected between the voltage pad 508 and the first signal pad 502, whereas the second resistor 515 is electrically connected between the ground pad 506 and the second signal pad 504.

Both coaxial cables 510 and 512 have a solid central conductor 516 and 518 surrounded by an insulator, in turn surrounded by a cylindrical shield 520 and 522 woven from fine wires. The cylindrical shield 520 of the first coaxial cable 510 is electrically connected to a portion of the ground pad 506. The central conductor 516 of the first coaxial cable 510 is electrically connected to the first signal pad 502. The cylindrical shield 522 of the second coaxial cable 512 is as well electrically connected to a portion of the ground pad 506. The central conductor 518 of the second coaxial cable 512, however, is electrically connected to the second signal pad 504.

Figure 6:
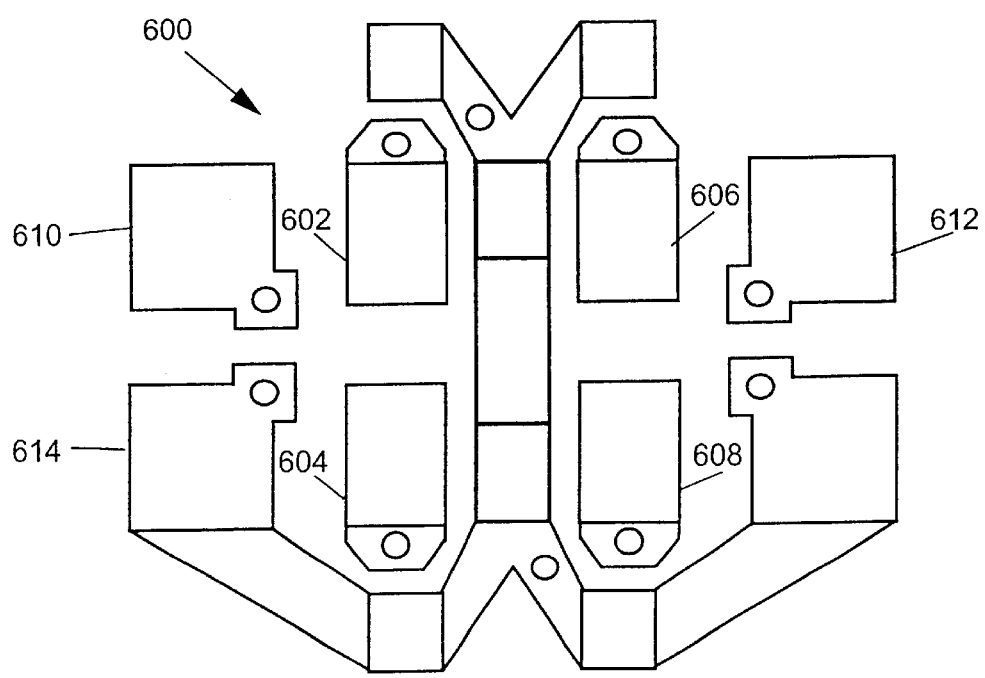
FIG. 6 shows a first example of placement overlapping of two pad arrangements of FIG. 2 in accordance with the present invention.

In FIG. 6 a first example of placement overlapping of two pad arrangements as explained in further detail with reference to FIG. 2 is shown in accordance with the present invention. There is depicted a complex pad arrangement 600 basically consisting of a first pad arrangement and a second pad arrangement that is basically a mirrored first pad arrangement. The complex pad arrangement 600 comprises a first signal pad 602, a second signal pad 604, a third signal pad 606 and a fourth signal pad 608. Furthermore it comprises a first voltage pad 610 and a second voltage pad 612 and a ground pad 614. According to the embodiment shown in FIG. 6 the portion of the ground pad running next to the first and second signal pad 602 and 604 is shared.

Figure 7:
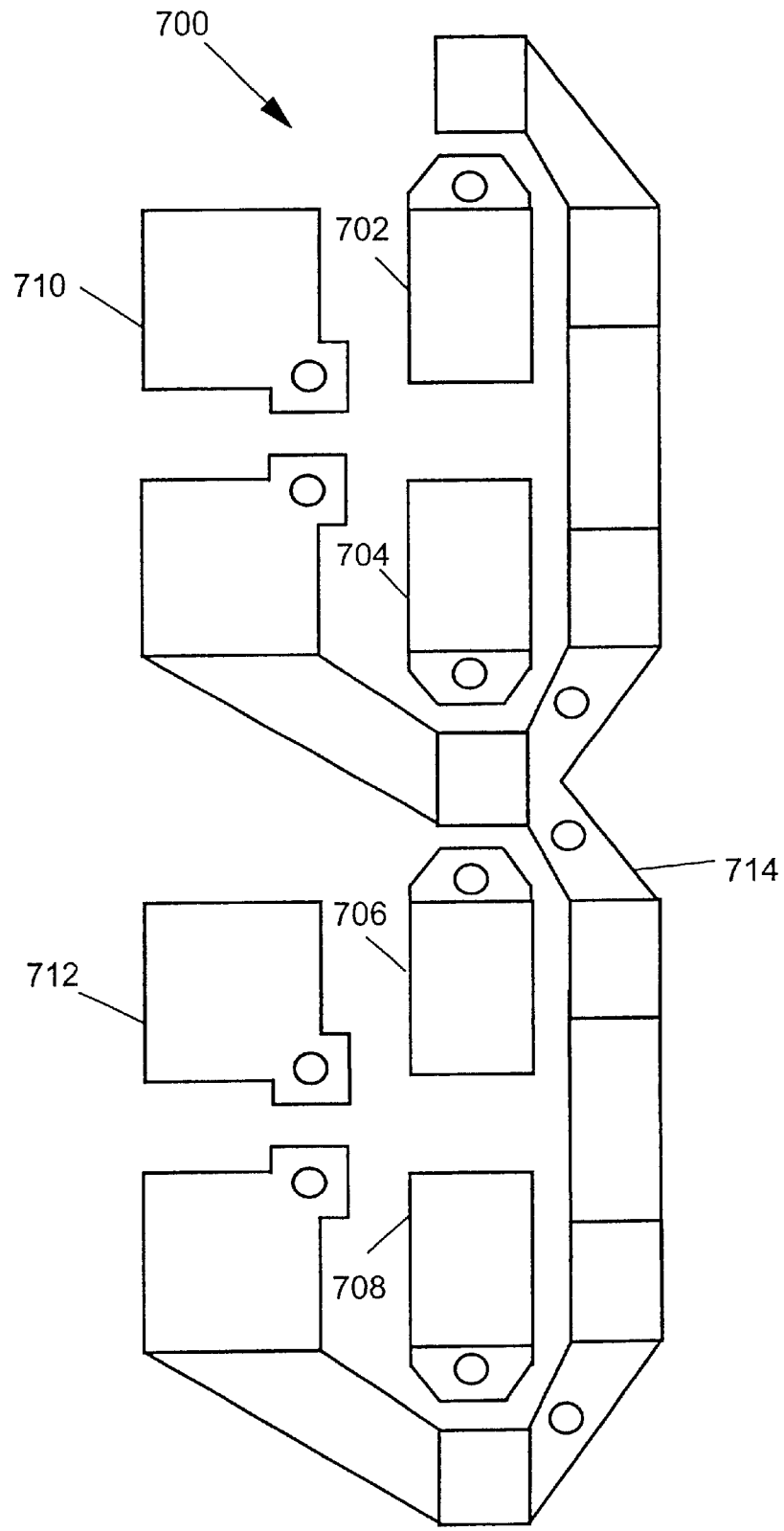
FIG. 7 shows a second example of placement overlapping of two pad arrangements of FIG. 2 in accordance with the present invention.

Finally with reference to FIG. 7, there is depicted a second example of placement overlapping of two pad arrangements as explained in further detail with reference to FIG. 2 is shown in accordance with the present invention. There is depicted a complex pad arrangement 700 basically consisting of a first pad arrangement and a second pad arrangement that is basically a mirrored first pad arrangement. The complex pad arrangement 700 comprises a first signal pad 702, a second signal pad 704, a third signal pad 706 and a fourth signal pad 708. Furthermore it comprises a first voltage pad 710 and a second voltage pad 712 and a ground pad 714. According to the embodiment shown in FIG. 7 the portion of the ground pad running between the second and the third signal pad 704 and 706 is shared.

What is claimed is:

1. A pad arrangement (200) on a printed circuit board (300) having two face surfaces for applying reworks or engineering changes to an electronic circuits to be formed on said printed circuit board (300), the pad arrangement (200) comprising:

a conducting path and pads on the surface of both faces of said printed circuit board (300) including, a first signal pad (202) for being electrically connected to a first signal line, a second signal pad (204) for being electrically connected to a second signal line, a ground pad (206) being connected to a ground line provided on said printed circuit board (300), and a voltage pad (208) being connected to a supply voltage line provided on said printed circuit board (300), whereby the pads (202, 204, 206, 208) are arranged in proximity to each other for facilitating a placement of electronic devices (414, 514, 515) between at least two of said pads (202, 204, 206, 208), and a third signal pad being electrically connected to said first signal pad (202), a fourth signal pad being electrically connected to said second signal pad (204), another ground pad being connected to a ground line provided on said printed circuit board, and another voltage pad being connected to a supply voltage line provided on said printed circuit board (300), whereby the pads are placed on the opposite surface of said printed circuit board (300) and are again arranged in proximity to each other for facilitating a placement of electronic devices (414, 514, 515) between at least two of said pads, and wherein a group of two signal pads (202, 204, 206, 208), a ground pad (206) and a voltage pad (208) are substantially arranged in the edges of a square and wherein in said group said ground pad (206) and said voltage pad (208) are arranged next to each other; and the connection between said ground pad (206) to said ground line and between said voltage pad (208) to said voltage line are formed basically on the edge of the respective pad which is closest to the respective other of said signal pads (202, 204, 206, 208).

2. The pad arrangement according to claim 1, wherein the connection between said first signal pad (202) to said third signal pad and between said second signal pad (204) to said fourth signal pad are formed basically on the edge of the respective pad which is furthest away from the respective other of both pads (202, 204, 206, 208).

3. The pad arrangement according to claim 2, wherein said ground pad (206) extends on the respective surface of said printed circuit board (300) basically around said adjacent signal pad forming further areas for soldering electrical elements onto.

4. The pad arrangement according to claim 3, wherein said ground pad (206) extends further to the opposite side of the other signal pad.

5. The pad arrangement according to claim 4, wherein said ground pad (206) is provided with further electrical connections to the respective ground line.

6. The pad arrangement according to claim 5, wherein at least one of the pads (202, 204, 206, 208) is connected to an embedded conducting path for connecting the pad to a pad of another pad arrangement (200) for applying reworks or engineering changes.

7. A printed circuit board (300) according to claim 6, comprising at least one pad arrangement (200) for applying reworks or engineering changes.

8. The printed circuit board (300) according to claim 7, wherein two of said pad arrangements are formed on one surface so that at least parts of said ground pad (206) is shared between them.

* * * * *